Sept. 8, 1964 B. M. BROWN 3,147,779

CUTTING AND FORMING TRANSISTOR LEADS

Filed Sept. 16, 1960 2 Sheets-Sheet 1

INVENTOR.
BRUCE M. BROWN.
BY
[signature]
ATTORNEY.

Sept. 8, 1964 B. M. BROWN 3,147,779

CUTTING AND FORMING TRANSISTOR LEADS

Filed Sept. 16, 1960 2 Sheets-Sheet 2

INVENTOR.
BRUCE M. BROWN.
BY
Louis P. Elbinger
ATTORNEY.

United States Patent Office 3,147,779 Patented Sept. 8, 1964

3,147,779

CUTTING AND FORMING TRANSISTOR LEADS

Bruce M. Brown, Scottsdale, Ariz., assignor to General Electric Company, a corporation of New York Filed Sept. 16, 1960, Ser. No. 56,517
2 Claims. (Cl. 140—71)

This invention relates to cutting and forming transistor leads. More particularly, it relates to apparatus suitable for shaping transistor leads to adapt a transistor to be conveniently mounted in a printed circuit board and to an improved transistor lead configuration.

In the past it has been difficult to mount transistors in boards having printed circuits. Most transistors are presently manufactured with three long adjacent parallel leads extending from the bottom of the transistor body [JEDEC T0–9 (Joint Electron Device Engineering Council designation), for example]. It has been found desirable to space the transistor body a certain minimum distance from the printed circuit board when it is mounted on the board. Normally such printed circuit boards have holes drilled through the board at the places where the transistor leads are to be inserted in the board and soldered or otherwise electrically connected to the printed circuit. It is present practice to insert the transistor leads into their proper drilled holes and push the transistor downwards until it reaches a proper spacing above the level of the board. To hold the transistor in place during the succeeding steps of manufacture, it is then required that some type of artificial spacer be inserted between the bottom of the transistor and the top of the board to maintain the transistor in position. Even when this is done, the relatively long transistor leads extend too far beneath the board and these long leads interfere with convenient handling of the board. Thus the leads must be cut. It is then required that the transistors be held in place (with sockets, for example) until the leads are soldered or otherwise fastened in the board so that they make proper electrical contact with the printed circuit of the board.

It is an object of the present invention to provide a novel apparatus for cutting and shaping transistor leads to provide an improved lead construction.

It is another object of the present invention to provide means for obtaining a transistor lead construction of such form that the leads themselves provide support for the transistor when mounted in a printed circuit board and provide a proper spacing of the transistor above the board.

It is an additional object of this invention to provide means for obtaining a transistor lead construction wherein the leads have a "self-locking" feature, i.e., they are held in place when the transistor has been inserted to its proper spacing in the board.

A still further object of this invention is to provide a means for cutting and forming transistor leads whereby a useful lead construction may be obtained without injury or damage to the transistor.

Yet another object is to provide an improved transistor lead construction.

Briefly stated, the apparatus of the present invention includes a nest for receiving the leads to be cut and formed, a clamp for clamping the leads adjacent the transistor body to protect the transistor from damage during the cutting and forming operations, shear blades for cutting the leads to the desired length, a forming punch for shaping the leads to the desired configuration, and reciprocable driving means for actuating the clamp, the shear blades, and the forming punch.

While the specification concludes with claims, particularly pointing out and distinctly claiming the subject matter of the present invention, it is believed that the invention will be better understood from the following description taken in connection with the accompanying drawings in which:

Figure 1:
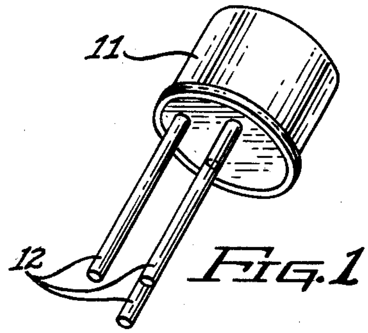
FIGURE 1 is a perspective view of a transistor before its leads have been cut and formed by the apparatus of the present invention.

FIGURE 1 illustrates a transistor body 11 having three leads 12 for making electrical connections to the transistor within the transistor body 11. FIGURE 1 is illustrative of the physical structure of a transistor (JEDEC T0–9 configuration is illustrated) as it normally appears before its leads are cut and formed by the apparatus of the present invention. The leads 12 are long (proportionately longer and thinner than illustrated) and relatively straight.

Figure 2:
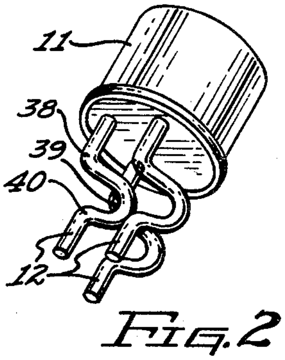
FIGURE 2 is a perspective view of a transistor such as that shown in FIGURE 1 whose leads have been cut and formed by the apparatus of the present invention.

FIGURE 2 shows the physical structure of the transistor of FIGURE 1 after its leads 12 have been cut and formed by the apparatus of the present invention. It is noted that the leads 12 have been made shorter and are each bent at the same distance from the lead entry into the transistor body 11. Each lead 12 includes a first bend 38 of about 90 degrees followed by a second bend 39, in the opposite direction from the first bend 38, of about 180 degrees, followed by a third bend 40, in the opposite direction from the second bend 39, of about 90 degrees.

Figure 3:
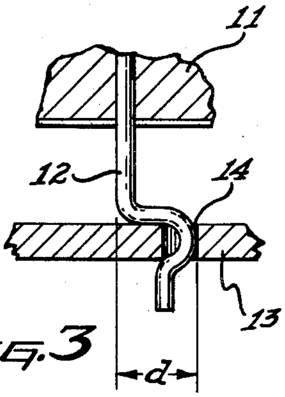
FIGURE 3 is a sectional view illustrating the manner in which a transistor lead, as cut and formed by the apparatus of the present invention, may be inserted in a printed circuit board.

FIGURE 3 is a fragmentary sectional view through one of the leads 12 of the transistor body 11 after the lead 12 has been cut and formed by the apparatus of the present invention. The lead 12 is shown inserted into a printed circuit board 13 through the drilled hole 14. Since the distance, *d*, across the widest portion of the bend in lead 12 is greater than the diameter of drilled hole 14, transistor body 11 is held in spaced relationship from printed circuit board 13 by the lead 12.

Since the lead 12 is a thin metal conductor, it acts somewhat like a spring when bent. The bent portion of lead 12 to be inserted in the drilled hole 14 is made slightly wider than the diameter of the drilled hole 14. Because of the resilient nature of the thin bent lead 12, it may still be easily inserted into the drilled hole 14. Once inserted, however, lead 12 is held firmly in drilled hole 14 by the elastic pressure which the bottom portion of lead 12 exerts upon the surface of drilled hole 14. In other words, the lead 12, when properly cut and formed according to the present invention, has a "self-locking" feature when inserted in drilled hole 14. In the transistor lead construction of the present invention, each lead 12 should include a first bend of at least about 45 degrees, followed by a second bend in the opposite direction from the first bend and of a greater angular magnitude than the first bend.

Figures 4, 5, 7, 8:
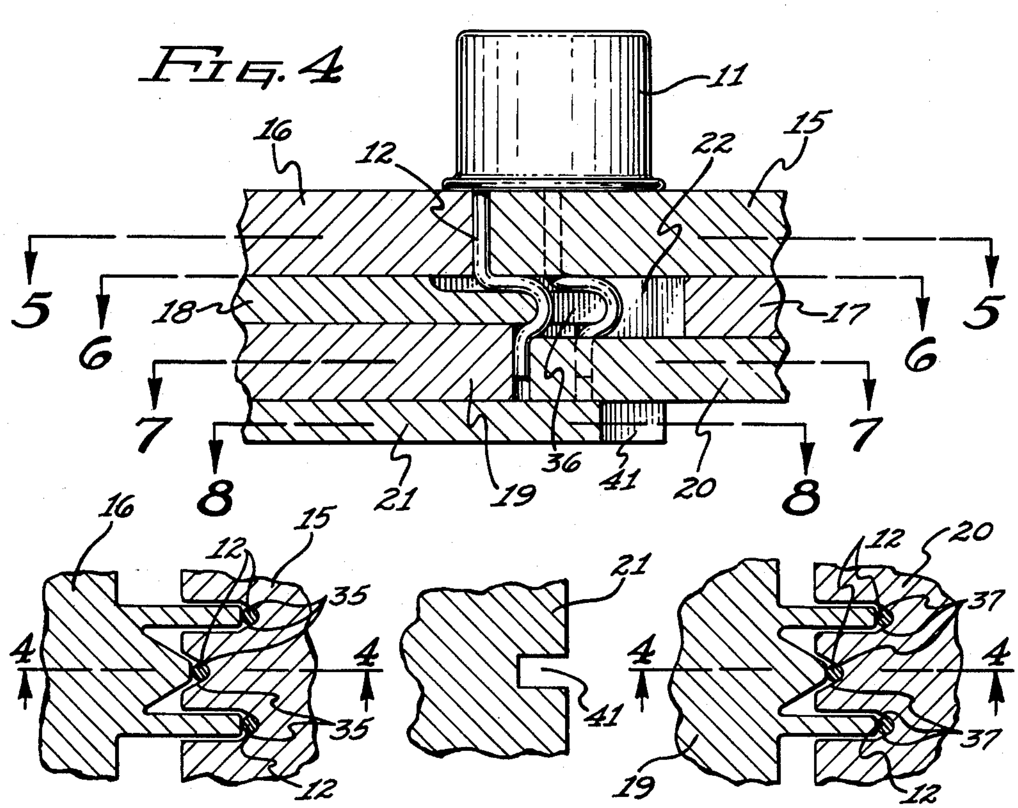
FIGURE 4 is a sectional view illustrating that portion of the apparatus of the present invention which actually performs the cutting and forming of transistor leads.
FIGURE 5 is a sectional view of the apparatus of FIGURE 4 through the section 5—5 of FIGURE 4.
FIGURE 7 is a sectional view of the apparatus of FIGURE 4 through the section 7—7 of FIGURE 4.
FIGURE 8 is a sectional view of the apparatus of FIGURE 4 through the section 8—8 of FIGURE 4.
Figure 9:
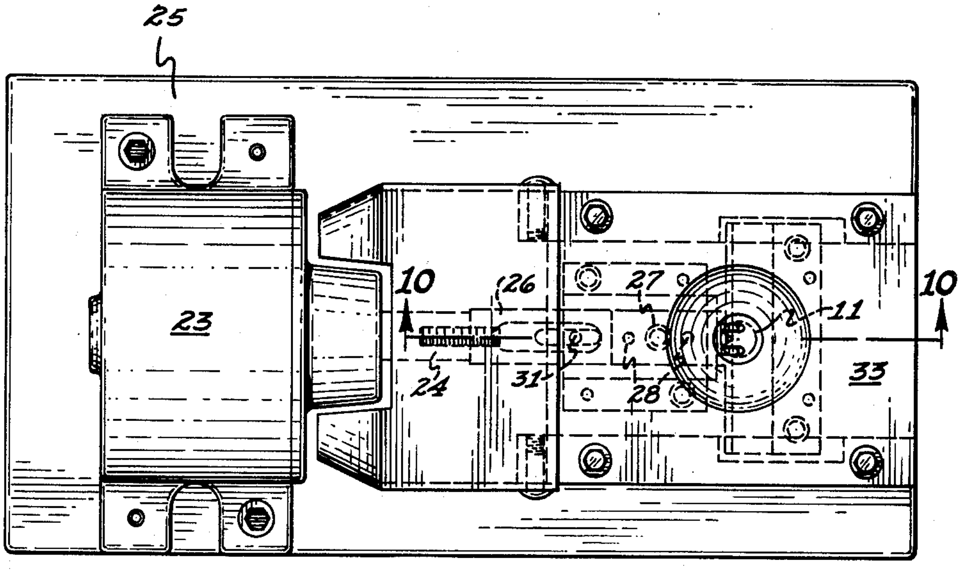
FIGURE 9 is a top view of a preferred embodiment of the apparatus of the present invention.
Figure 10:
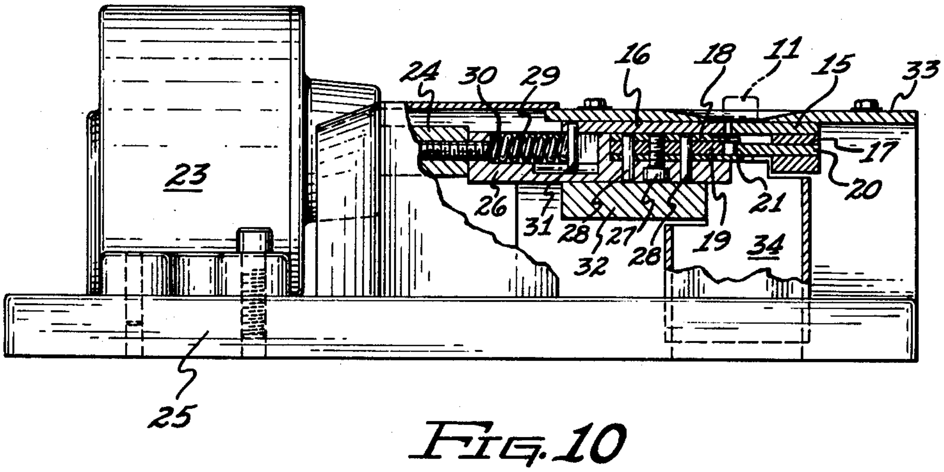
FIGURE 10 is a side view, partially in section, of the apparatus illustrated in FIGURE 9.

FIGURE 4 is an exploded view of the apparatus of the present invention, as illustrated in FIGURES 9 and 10, in the region where the cutting and forming of the leads 12 occurs. The apparatus of FIGURE 4 is shown in its closed position, that is, its position immediately after the leads 12 have been cut and formed. The parts of the apparatus shown are a fixed clamping member 15, a moveable clamping member 16, a spacer member 17, an upper forming punch member 18, a lower forming punch member 19, a fixed shear blade 20, and a moveable shear blade 21. The fixed clamping member 15, the spacer member 17, and the fixed shear blade 20 are immovably mounted, as to a frame member, and may be attached to each other. The moveable clamping member 16 is resiliently attached to a reciprocal driving means (not shown in FIGURE 4) and may be driven resiliently, as through a spring, in a horizontal direction from left to right. The upper forming punch member 18, the lower forming punch member 19, and the moveable shear blade 21 are directly attached to a reciprocal driving means, such as the piston of an air cylinder, to be reciprocally driven as a group in the horizontal direction and may be attached to each other.

When the apparatus of FIGURE 4 is in its open position, that is, its position before the leads 12 are cut and formed and when moveable clamping member 16, upper forming punch member 18, lower forming punch member 19, and moveable shear blade 21 are all in a position far left of leads 12, moveable clamping member 16 extends to the right further than either of the forming punch members 18, 19 or the moveable shear blade 21. As all four of these members 16, 18, 19, 21 are driven to the right, moveable clamping member 16 is the first to contact leads 12 and, in conjunction with fixed clamping member 15, clamps tightly the upper portions of leads 12. However, as mentioned, moveable clamping member 16 is resiliently driven, e.g., through a spring, and members 18, 19, and 21 are directly driven. Thus, after the upper portions of leads 12 are clamped, members 18, 19, and 21 are still driven to the right. The cutting and forming of leads 12 then takes place until the apparatus reaches its closed position, illustrated by FIGURE 4.

FIGURE 5 is a sectional view through the section 5—5 of FIGURE 4 and illustrates the construction and mutual relationship of fixed clamping member 15 and moveable clamping member 16. As shown, in its closed position, moveable clamping member 16 resiliently clamps leads 12 against fixed clamping member 15. The specific geometrical structures shown in FIGURES 4–8 are preferred ones for cutting and forming transistor leads of the JEDEC T0–9 configuration. Fixed clamping member 15 is dimensionally adapted so that the three transistor leads 12 can be respectively inserted into the three slots 35 of fixed clamping member 15 when the apparatus is in its open position, that is, before moveable clamping member 16 has been urged forward against the leads 12.

Figure 6:
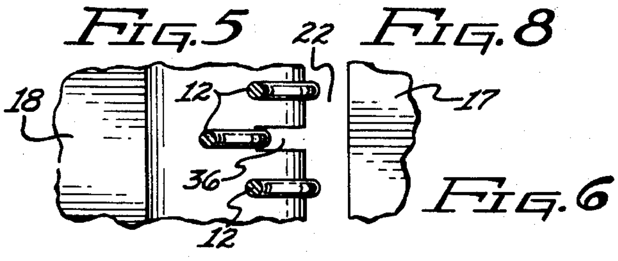
FIGURE 6 is a sectional view of the apparatus of FIGURE 4 through the section 6—6 of FIGURE 4.

FIGURE 6 is a sectional view through the section 6—6 of FIGURE 4 and shows in detail spacer member 17 and upper forming punch member 18. As illustrated, even when the apparatus of FIGURE 4 is in its closed position, there is a space in the horizontal direction between spacer member 17 and upper forming punch member 18. Spacer member 17 serves the purposes only of maintaining fixed clamping member 15 and fixed shear blade 20 in their proper spaced relationship with each other and of maintaining space 22 into which the leads 12 can bend as they are punched. Upper forming punch member 18 has a convex forward surface for properly shaping the leads 12 and contains slot 36 to enable all three leads 12 to be punched the same way at the same time.

FIGURE 7 is a sectional view of the apparatus of FIGURE 4 through the section 7—7 of FIGURE 4. FIGURE 7 shows the construction and mutual relationship of lower forming punch member 19 and fixed shear blade 20. The leads 12 are shown in their respective positions in the three slots 37 of the fixed shear blade 20. When the apparatus of FIGURE 4 is in its open position and the leads 12 are inserted in the slots 35 of fixed clamping member 15, a lower portion of each lead 12 is inserted into its proper slot 37 in fixed shear blade 20. In the apparatus as shown in FIGURE 4, the slots 35 do not precisely line up vertically with slots 37 and leads 12 inserted all the way into slots 35 may be only partially inserted into slots 37. The male pattern of the lower forming punch member 19 is adapted to fit the female pattern of the fixed shear blade 20 and to urge the leads 12 against the fixed shear blade 20 when the apparatus of FIGURE 4 assumes its closed position.

FIGURE 8 is a sectional view through the section 8—8 of FIGURE 4 of the moveable shear blade 21. The moveable shear blade 21 acts as a shear blade in conjunction with fixed shear blade 20, and, as shown, is indented at 41 so that upon movement of moveable shear blade from left to right all three leads 12 are sheared off at approximately the same time.

FIGURES 9 and 10 illustrate by top and side view, respectively, a preferred embodiment of the present invention. An air cylinder 23 suitably connected to a source of air pressure and a valve and including a piston 24 provides the required source of reciprocal motion. An air cylinder such as that known as the "Mead H–41" or its equivalent is suitable. The air cylinder 23 may be mounted as shown on a frame 25. The piston 24 is connected to and drives an intermediate rigid member 26. The upper forming punch member 18, the lower forming punch member 19, and the movable shear blade 21 are all rigidly connected to the intermediate rigid member 26 and to each other by means of screw 27 and pins 28. Coil spring 29 is situated in the intermediate rigid member 26, as shown, between a vertical face 30 of intermediate rigid member 26 and pin 31, which is rigidly attached to movable clamping member 16. When intermediate rigid member 26 is driven to the right, pin 31 is resiliently driven to the right by coil spring 29. Thus, moveable clamping member 16 is resiliently driven to the right also when the intermediate rigid member 26 is driven to the right. Intermediate rigid member 26 is slideably mounted on fixed member 32 and moveable clamping member 16 is slideably mounted on intermediate rigid member 26. Thus, when piston 24 is moved to the right, intermediate rigid member 26, upper forming punch member 18, lower forming punch member 19, and moveable shear blade 21 are urged as a group to the right. Moveable clamping member 16 is at the same time urged to the right, but in a resilient manner due to the interposition of coil spring 29 in its driving chain. Moveable clamping member 16 is mounted in sliding engagement with upper cover member 33.

Fixed clamping member 15, spacer member 17, and fixed shear blade 20 are rigidly mounted together and to frame 25. The exact configuration of and relationships among members 15–21 is most clearly shown in FIGURES 4–8 and reference is made to those figures and their description for such detailed information.

When a transistor 11 (shown by dotted lines in FIGURE 10) is fed to the described cutting and forming machine with its leads placed in the three slots 35 provided by fixed clamping member 15, the cutting and forming operation illustrated by FIGURE 4 and its corresponding description is ready to proceed. The piston 24 is initially in its most leftwards position, which is substantially to the left of its closed position as shown in FIGURES 9 and 10. And the cutting and forming of the transistor leads takes place when the piston 24 is urged to the right. As shown, a well 34 is provided into which the portions of the transistor leads cut off may fall and be collected or otherwise conveniently removed.

Although most of the various members of the apparatus described herein are illustrated as separate parts, it is, of course, possible to combine into single parts those members which act and move together. It is preferred, however, that all members which may wear or break, such as the various shear and punch members described herein, be embodied in separate parts for ease of removal and replacement.

From the foregoing, a novel transistor lead construction and novel apparatus for cutting and forming transistor leads is made clear.

While the principles of the invention have now been made clear in illustrative embodiments, there will be immediately obvious to those skilled in the art many modifications in structure, arrangement, proportions, the elements, materials and components used in the practice of the invention, and otherwise, which are particularly adapted for specific environments and operating requirements, without departing from those principles. The appended claims are, therefore, meant to cover and embrace any such modification, within the limits only of the true spirit and scope of the invention.

What is claimed is:

1. Apparatus for cutting and forming a plurality of leads extending from an electronic component comprising: nesting means including a plurality of slots, each of said slots being arranged to receive a different one of said leads, reciprocal driving means, clamping means resiliently mounted and driven by said driving means for clamping said leads in said slots at a point near said components so that said leads are held firmly throughout the cutting and forming operation, shearing means driven by said driving means and adapted for shearing said leads after they have been clamped by said clamping means to cut each of said leads to a given length, and forming means driven by said driving means and adapted for bending said leads into predetermined shapes after they have been cut by said shearing means.

2. Apparatus for cutting and forming a plurality of leads extending from an electronic component comprising: nesting means including a plurality of slots, each of said slots being arranged to receive a different one of said leads, reciprocal driving means, clamping means resiliently mounted and driven by said driving means for clamping said leads in said slots at a point near said component so that said leads are held firmly throughout the cutting and forming operation, shearing means driven by said driving means and adapted for shearing said leads after said leads have been clamped by said clamping means to cut each of said leads to a given length, and forming means driven by said driving means and adapted for bending each of said leads into identical shapes at a point intermediate their ends and said component.

References Cited in the file of this patent

UNITED STATES PATENTS

| | | |
|---|---|---|
| 1,765,357 | Regenstreif | June 17, 1930 |
| 1,791,378 | Regenstreif | Feb. 3, 1931 |
| 2,361,983 | Veley | Nov. 7, 1944 |
| 2,779,993 | Pityo | Feb. 5, 1957 |
| 2,906,930 | Raithel | Sept. 29, 1959 |
| 2,917,684 | Becherer | Dec. 15, 1959 |
| 3,020,936 | Bracci | Feb. 13, 1962 |
| 3,059,321 | Pityo | Oct. 23, 1962 |